US012620980B2

(12) United States Patent
Tsai et al.

(10) Patent No.: US 12,620,980 B2

(45) Date of Patent: May 5, 2026

(54) MULTI-MODULUS DIVIDER

(71) Applicant: QUALCOMM Incorporated, San Diego, CA (US)

(72) Inventors: Tu-I Tsai, Sunnyvale, CA (US); Taeho Seong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 83 days.

(21) Appl. No.: 18/437,020

(22) Filed: Feb. 8, 2024

(65) Prior Publication Data

US 2025/0260394 A1    Aug. 14, 2025

(51) Int. Cl.
| | |
|---|---|
| *H03K 3/037* | (2006.01) |
| *H03K 5/01* | (2006.01) |
| *H03L 7/08* | (2006.01) |
| *H03K 5/00* | (2006.01) |

(52) U.S. Cl.
CPC .............. *H03K 3/037* (2013.01); *H03K 5/01* (2013.01); *H03L 7/08* (2013.01); *H03K 2005/00013* (2013.01)

(58) Field of Classification Search
CPC ..................... H03K 3/037; H03K 5/01; H03K 2005/00013; H03K 21/00; H03K 21/02; H03K 21/026; H03K 21/08; H03K 21/10; H03K 23/00; H03K 23/40; H03K 23/42; H03K 23/425; H03K 23/50; H03K 23/58; H03K 29/00; H03L 7/08; H03L 7/18; H03L 7/1803
See application file for complete search history.

(56) References Cited

U.S. PATENT DOCUMENTS 7,430,264 B2 *   9/2008  Boerstler .............. G06F 1/3203
                                          375/376

OTHER PUBLICATIONS

Lam C., et al., "A 2.6-GHz/5.2-GHz Frequency Synthesizer in 0.4-um CMOS Technology", IEEE Journal of Solid-State Circuits, Jun. 2000, vol. 35, No. 5, 7 Pages.

* cited by examiner

*Primary Examiner* — Jung Kim

(74) *Attorney, Agent, or Firm* — Patterson + Sheridan, L.L.P.

(57) ABSTRACT

A multi-modulus divider includes a prescaler and a finite state machine. The prescaler includes a combinational logic circuit programmable to divide a frequency of an input clock signal by a first value or a second value. The multi-modulus divider includes a first flip-flop having a data input coupled to an output of the prescaler and an output coupled to an input of the finite state machine. The multi-modulus divider includes a second flip-flop having a data input coupled to the finite state machine such that the data input is configured to receive a programming signal output by the finite state machine and associated with programming the combinational logic circuit. The multi-modulus divider includes a third flip-flop having a data input coupled to an output of the second flip-flop. The third-flip flop also has an output coupled to the combinational logic circuit.

11 Claims, 7 Drawing Sheets

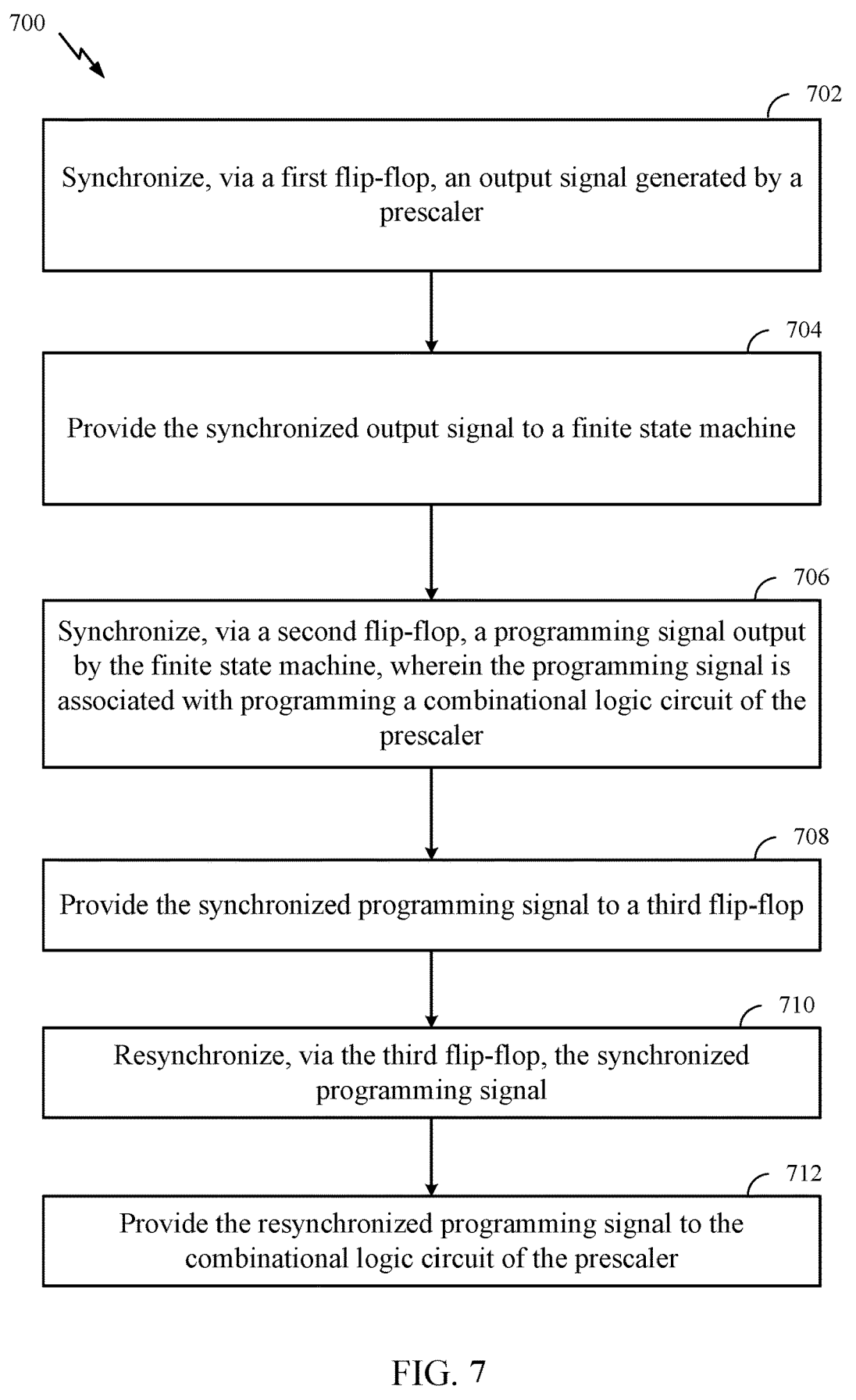

700

702

Synchronize, via a first flip-flop, an output signal generated by a prescaler

704

Provide the synchronized output signal to a finite state machine

706

Synchronize, via a second flip-flop, a programming signal output by the finite state machine, wherein the programming signal is associated with programming a combinational logic circuit of the prescaler

708

Provide the synchronized programming signal to a third flip-flop

710

Resynchronize, via the third flip-flop, the synchronized programming signal

712

Provide the resynchronized programming signal to the combinational logic circuit of the prescaler

FIG. 7

MULTI-MODULUS DIVIDER

TECHNICAL FIELD

Certain aspects of the present disclosure generally relate to electronic circuits and, more particularly, to multi-modulus dividers, which may be used in frequency synthesizers, for example.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) or other wireless network node via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include at least one frequency synthesizer to generate and control a local oscillator (LO) signal for mixing with a baseband signal (or a radio frequency (RF) signal) for upconversion (or downconversion) to an intermediate frequency (IF) signal or an RF signal (or an IF signal or a baseband signal) before transmission (after reception).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include using dedicated flip-flops between a prescaler of a multi-modulus divider and a finite state machine of the multi-modulus divider to improve performance (e.g., relaxed flip flop speeds) of the multi-modulus divider at certain frequencies (e.g., above 7 Gigahertz) by eliminating a delay associated with the prescaler of the multi-modulus divider.

Certain aspects of the present disclosure provide a multi-modulus divider. The multi-modulus divider includes a prescaler and a finite state machine. The prescaler includes a combinational logic circuit programmable to divide an input clock signal by a first value or a second value. The multi-modulus divider includes a first flip-flop having a data input coupled to an output of the prescaler and an output coupled to an input of the finite state machine. The multi-modulus divider includes a second flip-flop having a data input coupled to the finite state machine such that the data input is configured to receive a programming signal output by the finite state machine and associated with programming the combinational logic circuit. The multi-modulus divider includes a third flip-flop having a data input coupled to an output of the second flip-flop. The third-flip flop also has an output coupled to the combinational logic circuit.

Certain aspects of the present disclosure provide a method of clock signal generation. The method generally includes synchronizing, via a first flip-flop, an output signal generated by a prescaler; providing the synchronized output signal to a finite state machine; synchronizing, via a second flip-flop, a programming signal output by the finite state machine, wherein the programming signal is associated with programming a combinational logic circuit of the prescaler; providing the synchronized programming signal to a third flip-flop; resynchronizing, via the third flip-flop, the synchronized programming signal; and providing the resynchronized programming signal to the combinational logic circuit of the prescaler.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 is a flow diagram of example operations for clock signal generation, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
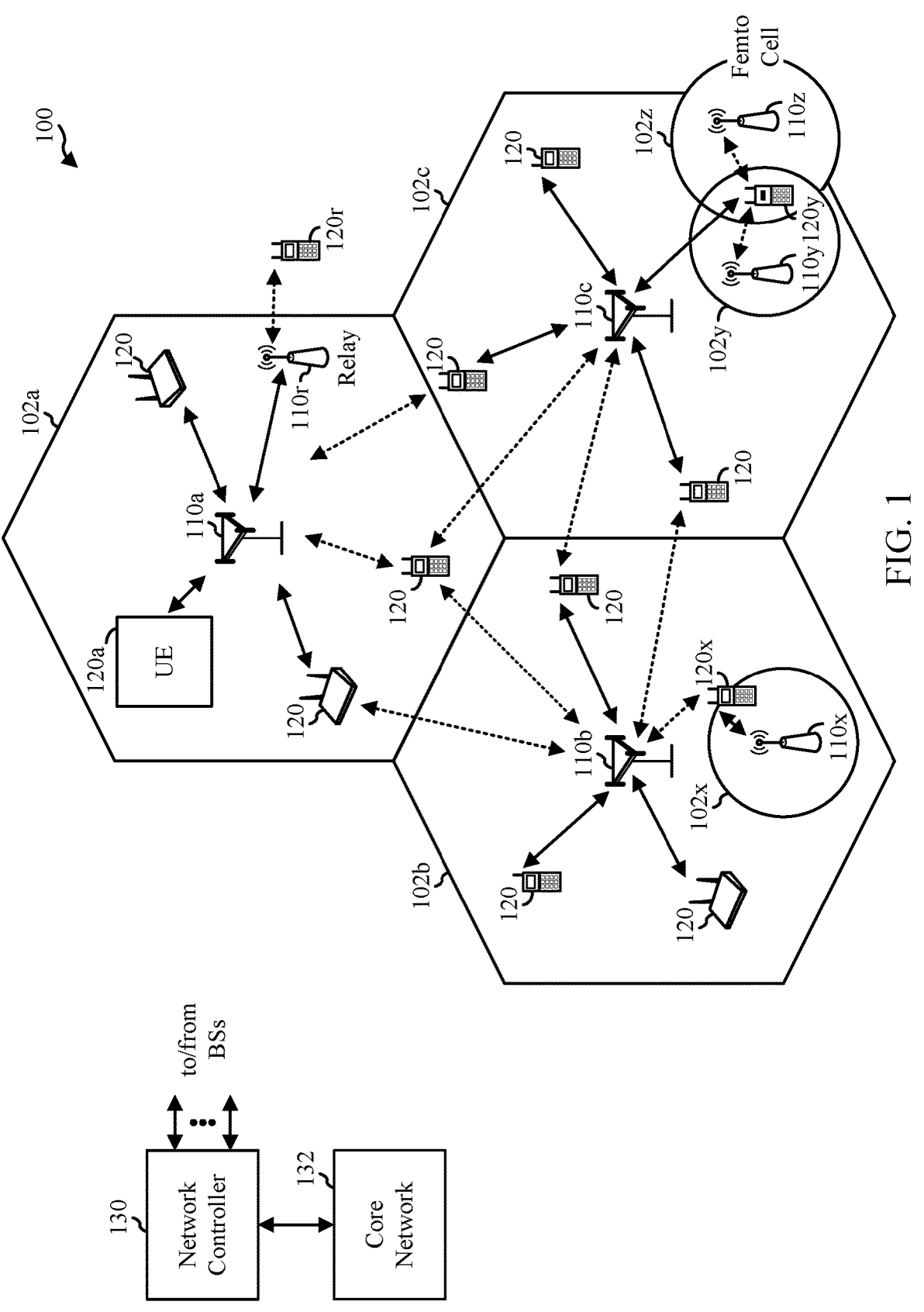
FIG. 1 is a diagram of an example wireless communications network, in which aspects of the present disclosure may be practiced.

Certain aspects of the present disclosure relates to multi-modulus dividers that may, for example, be included in a frequency synthesizer used in electronic devices (e.g., smartphones, tablets). A multi-modulus divider may be used to divide a frequency of a clock signal (e.g., generated by multi-GHz Voltage Control Oscillator) by a number of different integer values to generate an output signal having different frequencies according to the different integer values. For instance, the output signal would have a first frequency when the frequency of the clock signal is divided by a first integer value and a second frequency that is different than the first frequency when the frequency of the clock signal is divided by a second integer.

The multi-modulus divider may include a prescaler and a finite state machine. The prescaler includes a combinational logic circuit that may be programmed (e.g., via the finite state machine) such that the prescaler divides a frequency of the input clock signal by a certain value to generate an output signal having a frequency that is a fraction of the clock signal frequency.

The finite state machine may receive the output signal from the prescaler. Furthermore, the finite state machine may provide a programming signal to the combinational logic circuit based, at least in part, on the output signal received from the prescaler. The programming signal may control the combinational logic circuit to cause the prescaler to switch from dividing the frequency of the input signal by a first integer value (e.g., N) to dividing the frequency of the input signal by a second integer value (e.g., N+1) that is different from the first integer value. By doing so, the finite state machine can configure the prescaler, specifically the combinational logic circuit thereof, to divide the frequency of the clock signal by a specified integer value (e.g., N or N+1).

The multi-modulus divider may include flip-flops coupled between the prescaler and the finite state machine to eliminate a combinational logic delay of the prescaler that increases (e.g., takes up a greater portion of a clock cycle) as the clock speed (e.g., frequency of the input clock signal) increases. For instance, a first flip-flop may be coupled between an output of the prescaler and an input of the finite state finite machine. A second flip-flop may be included in the finite state machine. In addition, a third flip-flop may be coupled between an output of the finite state machine and an input of the prescaler. The placement of the first flip-flop and the third flip-flop facilitates removal of the delay of the combinational logic circuit in the prescaler from the longest flop to flop delay of the multi modulus divider. Removing this delay relaxes (e.g., decreases) the flip-flop speed of the flip-flops of the multi-modulus divider, which is important to achieving a high-speed, low-power design at certain frequencies (e.g., above 9 Gigahertz).

Furthermore, since a portion of a clock cycle taken up by the combinational logic delay of the prescaler increases as a frequency of the input clock signal provided to the prescaler increases, multi-modulus dividers according to aspects of the present disclosure that remove the combinational logic delay of the prescaler from the longest flop to flop delay have improved performance compared to conventional multi modulus dividers as the frequency of the input clock signal increases (e.g., over 7 Gigahertz).

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include at least one phase-locked loop (PLL) circuit with a multi-modulus divider, as described in more detail herein.

Figure 2:
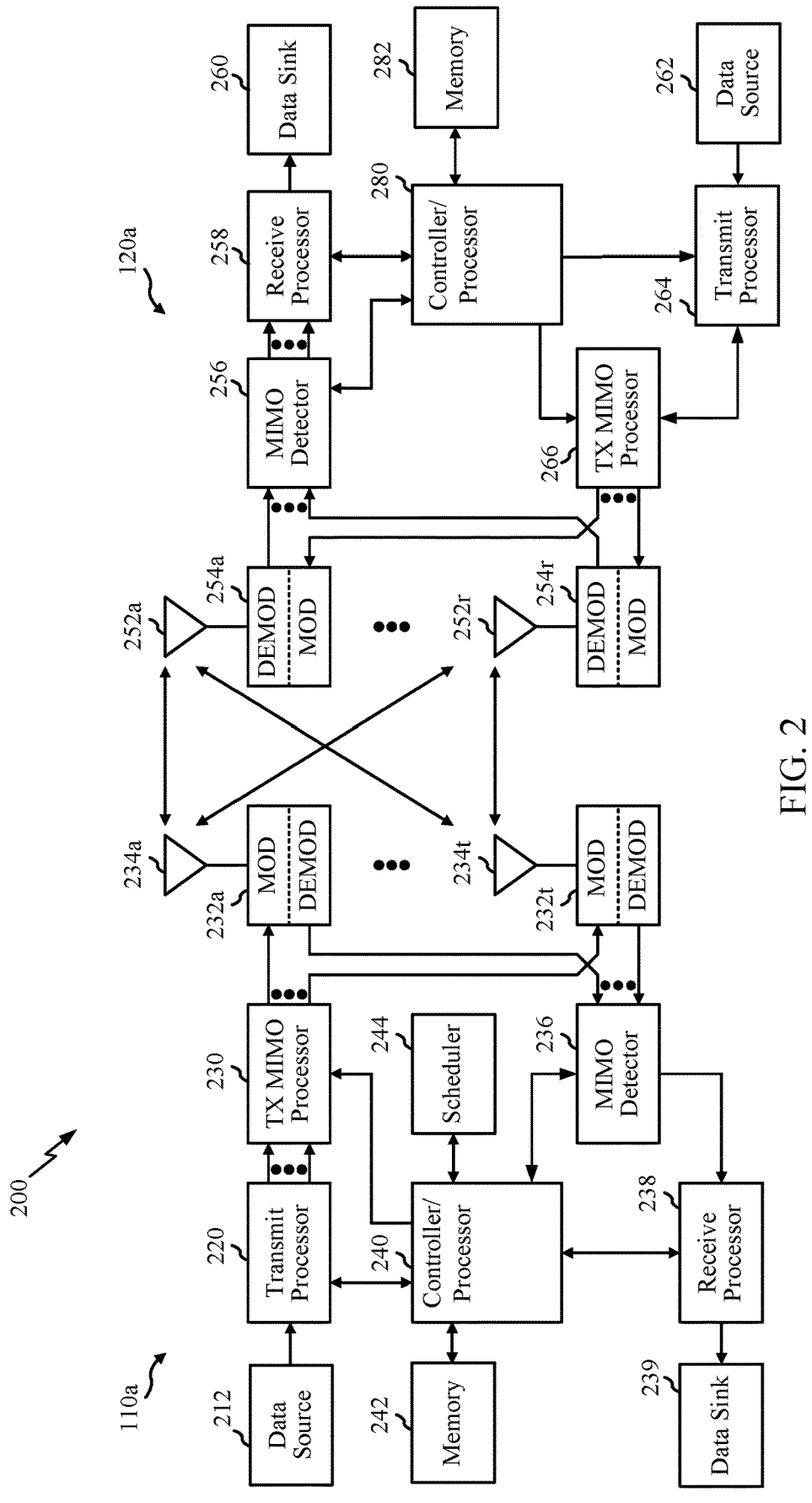
FIG. 2 is a block diagram conceptually illustrating a design of an example base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be pre-coded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include at least one phase-locked loop (PLL) circuit with a multi-modulus divider, as described in more detail herein.

Example RF Transceiver

Figure 3:
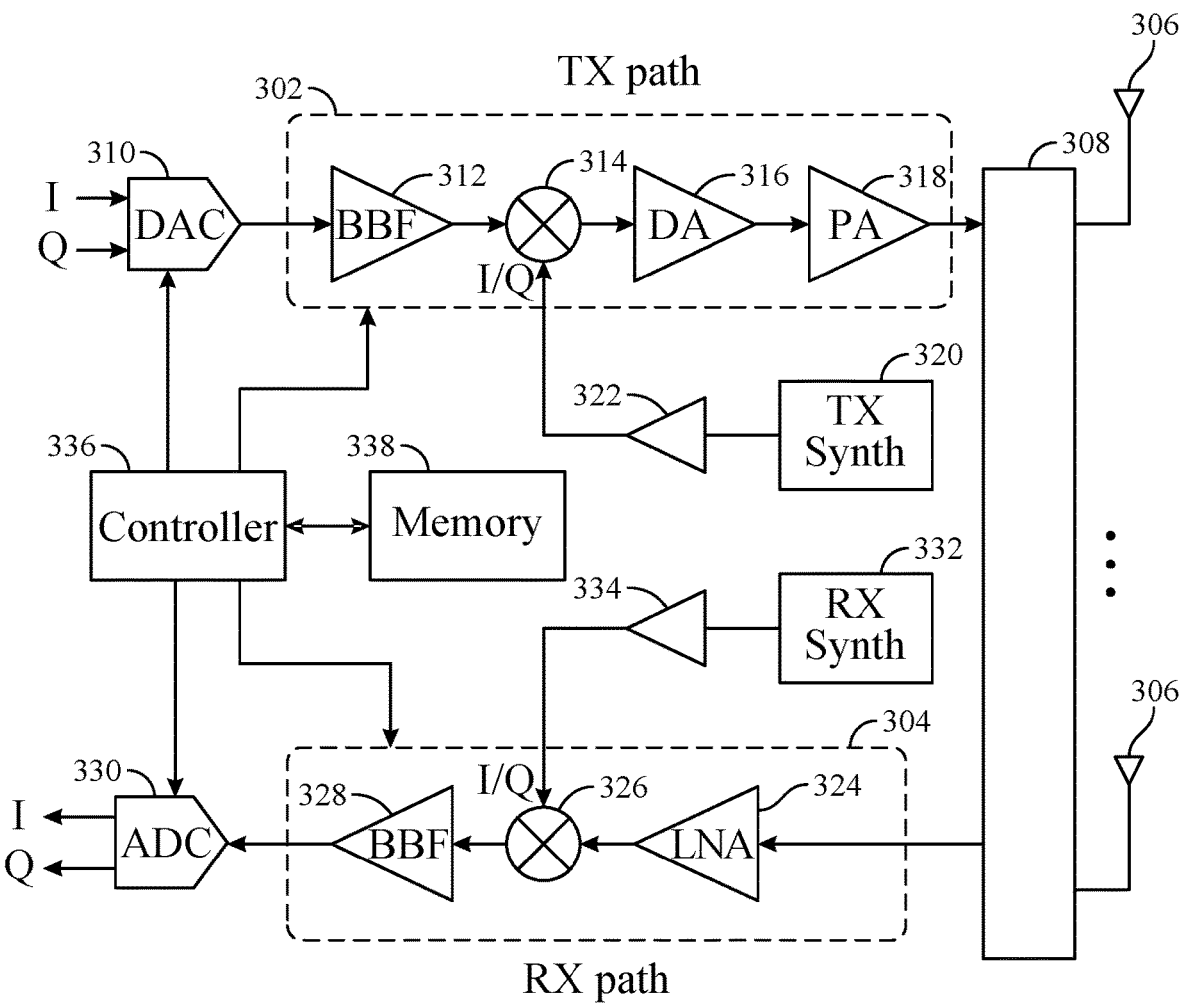
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320 with a transmit phase-locked loop (TxPLL). The transmit LO may be buffered or amplified by amplifier 322 before being mixed with the baseband signals in the mixer 314. Similarly, the receive LO may be produced by an RX frequency synthesizer 332 with a receive phase-locked loop (RxPLL). The receive LO may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for frequency synthesizers in any of various other suitable systems (e.g., video monitors, microprocessors, high-speed serializer/de-serializer (SerDes) systems, or other electronic systems).

Example Phase-Locked Loop

Figure 4:
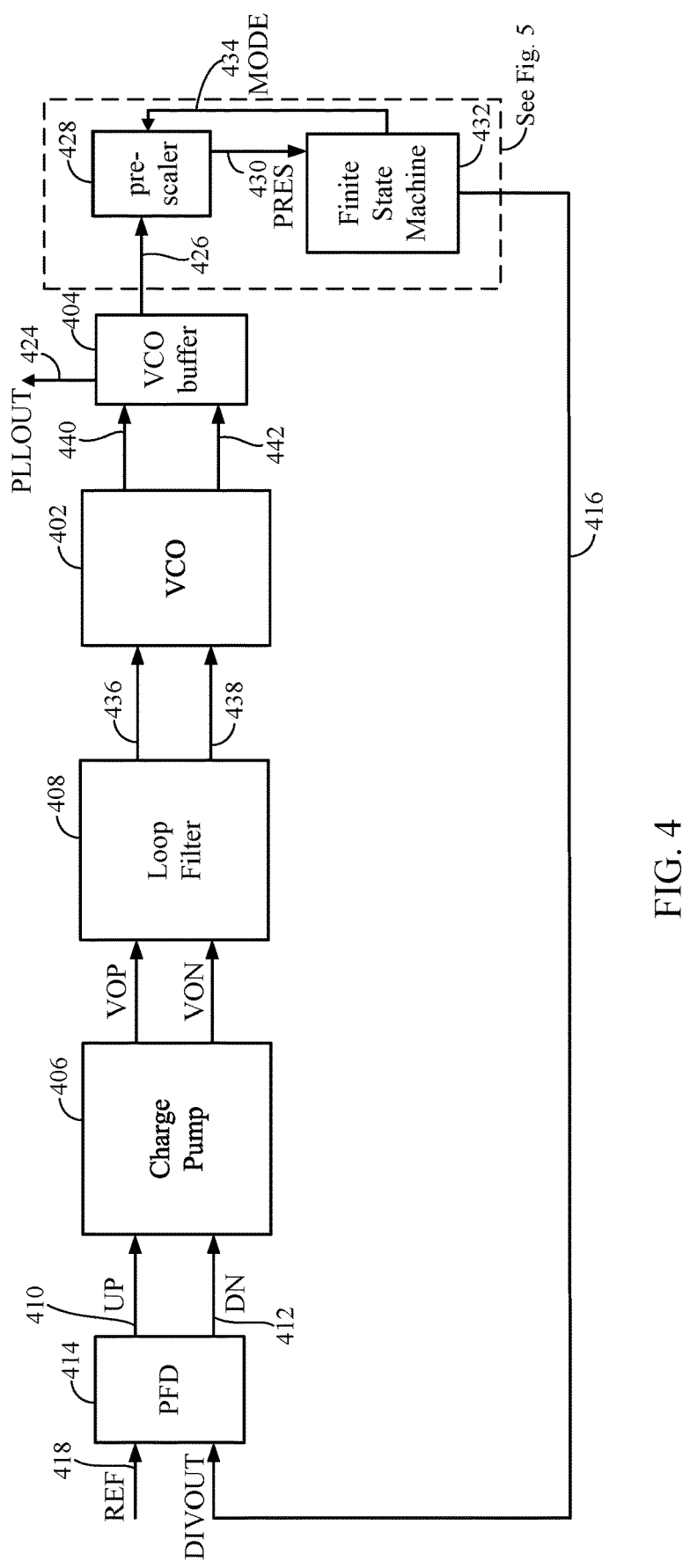
FIG. 4 is a block diagram of an example phase-locked loop (PLL), in which aspects of the present disclosure may be practiced.

FIG. 4 is a block diagram of an example phase-locked loop (PLL) 400, in which aspects of the present disclosure may be practiced. The PLL 400 may be utilized in a frequency synthesizer, such as a transmit phase-locked loop (TxPLL) in the TX frequency synthesizer 320 or a receive phase-locked loop (RxPLL) in the RX frequency synthesizer 332 of FIG. 3.

As illustrated in FIG. 4, a charge pump 406 coupled to a low-pass loop filter 408 (also referred to as a "charge pump filter" or "PLL loop filter") may provide a control voltage to a voltage-controlled oscillator (VCO) 402, where the control voltage is used to adjust an oscillation frequency of the VCO 402. The charge pump 406 and the VCO 402 may receive power via two power supply rails: a positive supply rail and a negative supply rail. Switches in the charge pump 406 may be controlled by up/down pulse signals 410, 412 (labeled "UP" and "DN"), and the loop filter 408 may reject the high frequency transient signals from this switching activity. These up/down pulse signals 410, 412 may be generated by a phase-frequency detector (PFD) 414, which may compare a feedback signal 416 (based on an output or processed output of the VCO 402 and labeled "DIVOUT") to a reference frequency signal 418 (labeled "REF").

In an aspect, as illustrated in FIG. 4, the feedback signal 416 may be generated by buffering the output of the VCO 402 with a VCO buffer 404 to generate the PLL's output signal 424 (labeled "PLLOUT") and a buffered VCO signal 426, scaling (e.g., dividing) the frequency of the buffered VCO signal 426 in a prescaler 428, and providing an output signal 430 (labeled "PRES") of the prescaler 428 to a finite state machine 432 to generate the feedback signal 416. Also, the finite state machine 432 may be programmed with settings for the prescaler 428. For example, the settings may include a plurality of different integer values (e.g., N, N+1, etc.) by which the prescaler 428 may be configured to divide the buffered VCO signal 426 to generate the output signal 430. As shown, the finite state machine 432 may output a programming signal 434 (labeled "MODE") to the prescaler 428 to select one of the plurality of different integer values (e.g., N, N+1, etc.) by which the prescaler 428 can divide the frequency of the buffered VCO signal 426 to generate the output signal 430. In this manner, a wider range of frequencies for the feedback signal 416 can be accommodated, which can allow the PLL 400 to better lock on to and track the reference frequency signal 418.

In some aspects of the present disclosure, as illustrated in FIG. 4, the input control voltage for the VCO 402 may be provided by the charge pump 406 and the low-pass loop filter 408 via VCO control inputs 436, 438. A resonant tank circuit of the VCO 402 may generate, at differential VCO outputs 440, 442, a periodic signal having a specific frequency (e.g., determined by a voltage at the VCO control inputs 436, 438), which may be input to the VCO buffer 404. The VCO buffer 404 may be coupled to the differential VCO outputs 440, 442 in an effort to isolate the VCO 402 from the load in the PLL 400 and other circuits receiving the PLL's output signal 424. The VCO buffer 404 may be also employed in an effort to amplify the signal swing and correct any duty cycle distortions of the differential VCO outputs 440, 442.

Although the PLL 400 is implemented as a differential circuit in FIG. 4, it is to be understood that the PLL may also alternatively be implemented as a single-ended circuit.

Example Multi-Modulus Divider

Figure 5:
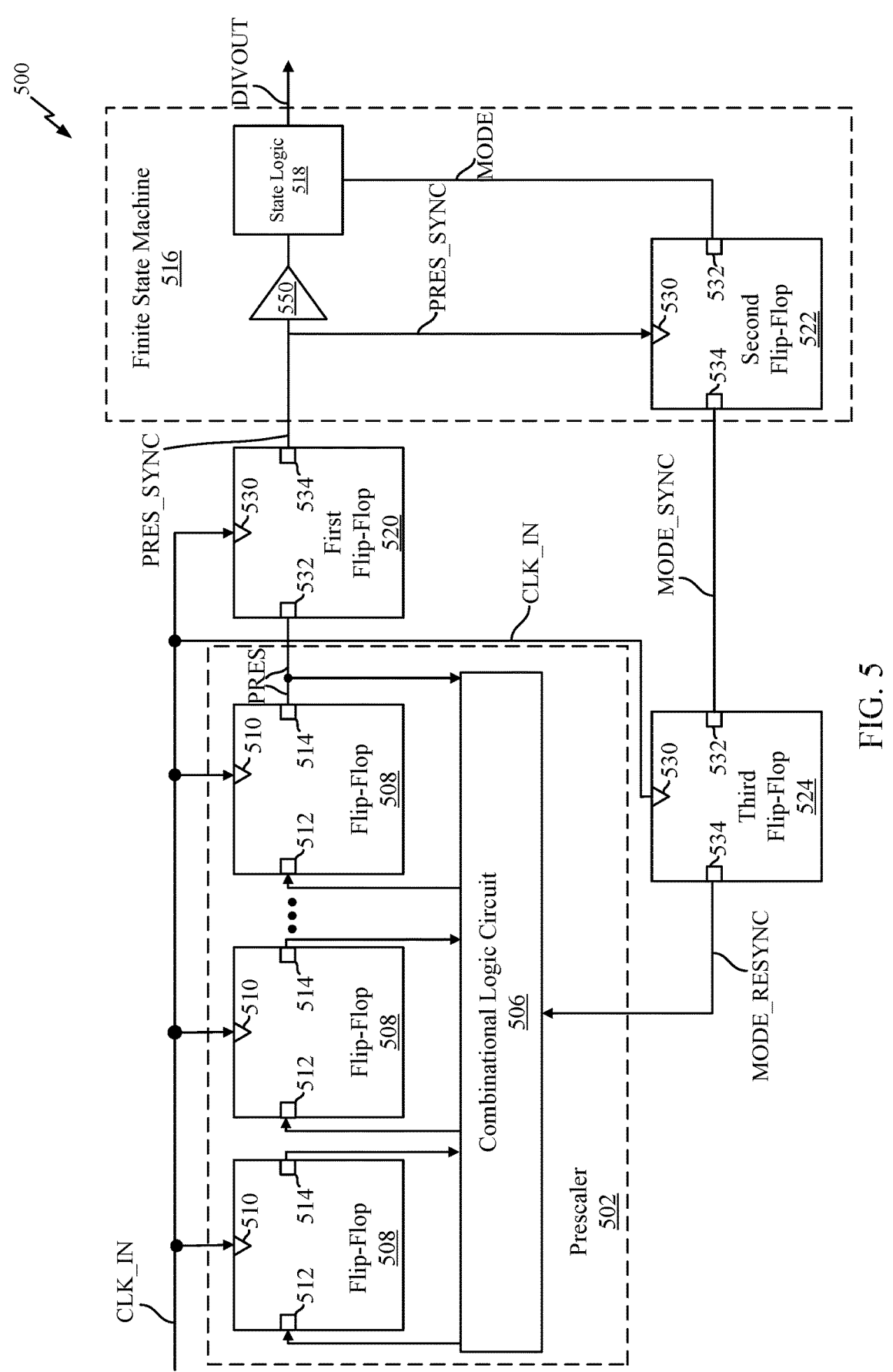
FIG. 5 is a block diagram of an example multi-modulus divider, in which aspects of the present disclosure may be practiced.

FIG. 5 is a block diagram of components of a multi-modulus divider 500, in which aspects of the present disclosure may be practiced. The multi-modulus divider 500 may be utilized in a PLL in a frequency synthesizer, such as the PLL 400 of FIG. 4. For example, in certain aspects of the present disclosure in which the multi-modulus divider 500 is implemented in the PLL 400 of FIG. 4, the multi-modulus divider 500 includes the prescaler 428 and the finite state machine 432.

When used in the PLL 400, the multi-modulus divider 500 may provide a wide range of division ratios, which allows the PLL 400 to generate a range of output frequencies (e.g associated with feedback signal 416) that can be adjusted. This is useful in applications, such as clock generation, where the PLL 400 needs to lock onto and generate specific output frequencies with precision. Thus, the multi-modulus divider 500 enhances the flexibility and versatility of the PLL 400 by enabling the PLL 400 to produce a wide range of output frequencies.

As illustrated, the multi-modulus divider 500 includes a prescaler 502. The prescaler 502 receives an input signal (e.g., a clock signal) and divides the frequency of the input signal by a certain value (e.g., an integer) to generate an output signal that is a fractional representation of the input signal. In this manner, the prescaler 502 allows for the generation of a lower-frequency signal from higher-frequency sources.

As shown, the prescaler 502 may receive an input clock signal CLK_IN (e.g., buffered VCO signal 426 from the VCO buffer 404 of FIG. 4). The prescaler 502 includes a combinational logic circuit 506 and a plurality of flip-flops 508. Each of the plurality of flip-flops 508 includes a clock input 510 configured to receive the input clock signal CLK_IN. Each of the plurality of flip-flops 508 further include a data input 512 and an output 514. The data input 512 and output 514 for each respective flip-flop of the plurality of flip-flops 508 is coupled to the combinational logic circuit 506. Thus, each of the plurality of flip-flops 508 may receive data from the combinational logic circuit 506 via the data input 512. In addition, each of the plurality of flip-flops 508 may output the data to the combinational logic circuit 506 via the output 514. The combinational logic circuit 506 may be programmed to cause the prescaler 502 to divide the frequency of the input clock signal CLK_IN by a certain value (e.g., an integer) to generate output signal PRES whose frequency is a fraction of the frequency of the input clock signal CLK_IN.

The multi-modulus divider 500 includes a finite state machine 516 that, in certain aspects of the present disclosure, further divides the frequency of the output signal PRES to generate divided clock signal DIVOUT. The finite state machine 516 also controls operation of the prescaler 502. More specifically, the finite state machine 516 may program the combinational logic circuit 506 of the prescaler 502 to cause the prescaler 502 to divide the frequency of the input clock signal CLK_IN by different integer values.

The finite state machine 516 includes state logic 518 that may control operation of the prescaler 502. More particularly, the state logic 518 may program the combinational logic circuit 506 such that the prescaler 502 operates in a first state in which the prescaler 502 divides the frequency of the input clock signal CLK_IN by a first integer value (e.g., N) or a second state in which the prescaler 502 divides the frequency of the input clock signal CLK_IN by a second integer value (e.g., N+1) that is different than the first integer value. In this manner, a frequency of the output signal PRES generated by the prescaler 502 can be adjusted as needed.

The multi-modulus divider 500 includes a first flip-flop 520, a second flip-flop 522, and a third flip-flop 524. The first flip-flop 520, the second flip-flop 522, and the third flip-flop 524 each include a clock input 530. The first flip-flop 520, the second flip-flop 522, and the third flip-flop 524 each further include a data input 532 and an output 534. Furthermore, in certain aspects of the present disclosure, the first flip-flop 520, the second flip-flop 522, and the third flip-flop 524 may each be a delay flip-flop.

As illustrated, the clock input 530 of the first flip-flop 520 receives the input clock signal CLK_IN. Furthermore, the first flip-flop 520 is coupled between the prescaler 502 and the finite state machine 516. More particularly, the data input 532 of the first flip-flop 520 is coupled to an output of the prescaler 502, and the output 534 of the first flip-flop 520 is coupled to an input of the finite state machine 516. In this manner, the first flip-flop 520 may synchronize (e.g., with the input clock signal CLK_IN) the output signal PRES generated by the prescaler 502. For example, the first flip-flop 520 may receive (e.g., at the data input 532 thereof) the output signal PRES generated by the prescaler 502 and output (e.g., at the output 534 thereof) a synchronized output signal PRES_SYNC that is then provided to the finite state machine 516. More particularly, the synchronized output signal PRES_SYNC may be provided to the state logic 518 of the finite state machine 516.

In certain aspects of the present disclosure, the finite state machine 516 may include a buffer 550 coupled between the first flip-flop 520 and the state logic 518. In this manner, the buffer 550 may receive the synchronized output signal PRES_SYNC and output a buffered version of the synchronized output signal PRES_SYNC. As illustrated, the state logic 518 may output the divided clock signal DIVOUT. The state logic 518 also outputs programming signal MODE to control operation of the combinational logic circuit 506 of the prescaler 502. More particularly, the programming signal MODE may program the combinational logic circuit 506 to cause the prescaler 502 to switch from the first state in which the prescaler 502 divides the input clock signal CLK_IN by the first value to the second state in which the prescaler 502 divides the input clock signal CLK_IN by the second value, or vice versa.

In certain aspects of the present disclosure, the finite state machine 516 may include the second flip-flop 522. More particularly, the second flip-flop 522 may be part of (e.g., internal to) the finite state machine 516. As illustrated, the synchronized output signal PRES_SYNC may be provided to the clock input 530 of the second flip-flop 522. Additionally, the programming signal MODE may be provided to the data input 532 of the second flip-flop 522. In this manner, the second flip-flop 522 may synchronize the programming signal MODE according to the synchronized output signal PRES_SYNC to output a synchronized programming signal MODE_SYNC.

As illustrated, the third flip-flop 524 may be coupled between the second flip-flop 522 and the combinational logic circuit 506. More particularly, the data input 532 of the third flip-flop 524 is coupled to the output 534 of the second flip-flop 522 such that the third flip-flop 524 receives the synchronized programming signal MODE_SYNC output by the second flip-flop 522. In addition, the output 534 of the third flip-flop 524 is coupled to the combinational logic circuit 506. Still further, the clock input 530 of the third flip-flop 524 may receive the input clock signal CLK_IN. In this manner, the third flip-flop 524 may resynchronize the synchronized programming signal MODE_SYNC according to the input clock signal CLK_IN and output a resynchronized programming signal MODE_RESYNC to the combinational logic circuit 506.

The placement of the first flip-flop 520 and the third flip-flop 524 between the prescaler 502 and the finite state machine 516 improves (e.g., reduces) a flop to flop delay of the multi-modulus divider 500 and therefore relaxes (e.g., decreases) the flip flop target speed, which may be more important as a frequency of the input clock signal CLK_IN increases (e.g., over 7 Gigahertz). More particularly, the longest flop to flop delay of the multi-modulus divider 500 is from the output 534 of the first flip-flop 520 to the data input 532 of the third flip-flop 524 and therefore can be represented by a summation of a first delay (e.g., clock to q delay) associated with the first flip-flop 520 and a second delay (e.g., clock to q delay) associated with the second flip-flop 522.

In this manner, the longest flop to flop delay of multi-modulus dividers according to aspects of the present disclosure, such as the multi-modulus divider 500 of FIG. 5, does not include a delay associated with the combinational logic circuit 506 of the prescaler 502. This is important because the delay associated with the combinational logic circuit 506 takes up a larger percentage of a clock cycle as the frequency of the input clock signal CLK_IN increases (e.g., more than 9 Gigahertz). Thus, the multi-modulus divider 500 having the first flip-flop 520 and the third flip-flop 524 according to certain aspects of the present disclosure has improved performance (e.g., relaxed flip flop speeds, so the power and area are reduced) compared to conventional multi-modulus dividers.

Figure 6:
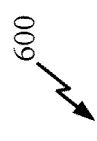
FIG. 6 illustrates a timing diagram for signals of a multi-modulus divider, in accordance with certain aspects of the present disclosure.
Figure 6:
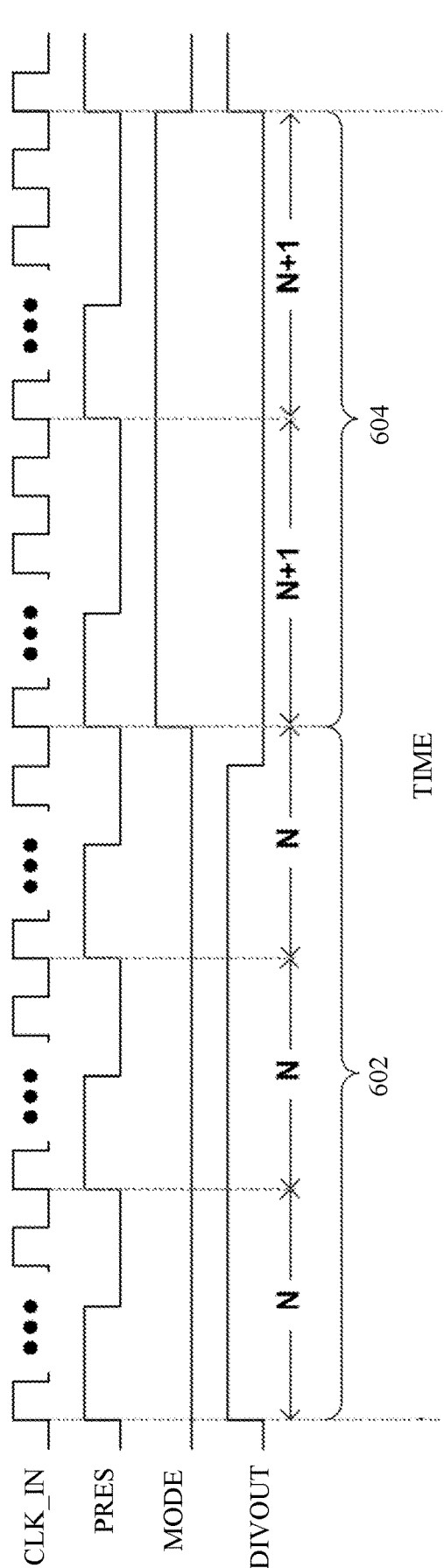

FIG. 6 illustrates a graphical representation 600 of various signals associated with the multi-modulus divider 500 of FIG. 5 as a function of time according to certain aspects of the present disclosure.

In certain aspects of the present disclosure, the prescaler 502 may, as discussed above, be configurable in a first state in which the prescaler 502 divides the frequency of the input clock signal CLK_IN by a first integer value (e.g., N) and a second state in which the prescaler 502 divides the frequency of the input clock signal CLK_IN by a second integer value (e.g., N+1) that is different from the first integer value. The programming signal MODE may program the combinational logic circuit 506 (FIG. 5) of the prescaler 502 (FIG. 5) such that the prescaler 502 operates in the first state for a first period of time 602 during which the prescaler 502 divides the frequency of the input clock signal CLK_IN by the first integer value (e.g., N) such that the divided output signal DIVOUT has a first frequency during the first period of time 602 and operates in the second state for a second period of time 604 during which the prescaler 502 divides the frequency of the input clock signal CLK_IN by the second integer value (e.g., N+1) such that the divided output signal DIVOUT has a second frequency during the second period of time 604. Being able to adjust the division ratio of the prescaler 502 allows the frequency range of the divided output signal DIVOUT to be widened, which can be particularly helpful when the multi-modulus divider 500 is used in a PLL (such as the PLL 400 of FIG.

4) of a frequency synthesizer as the PLL can generate output frequencies that are not simply multiples of the input frequency. It should be appreciated that the scope of the present disclosure is not intended to be limited by the examples provides for the first and second integers.

Example Operations for Clock Signal Generation

FIG. 7 is a flow diagram of example operations 700 for clock signal generation, in accordance with certain aspects of the present disclosure. The operations 700 may be performed, for example, by a multi-modulus divider. For simplicity, the operations 700 will be discussed in the context of the multi-modulus divider 500 of FIG. 5. Therefore, reference to components of the multi-modulus divider 500 may be referred to in the context of describing the various operations 700.

The operations 700 may generally involve, at block 702, synchronizing the output signal PRES generated by the prescaler 502. More particularly, the first flip-flop 520 may receive (e.g., at the data input 532 thereof) the output signal PRES and synchronize the output signal PRES according to the input clock signal CLK_IN that is provided to the prescaler 502 and the clock input 530 of the first flip-flop 520. In this manner, the first flip-flop 520 may output (e.g., at the output 534 thereof) the synchronized output signal PRES_SYNC. The operations 700 further include, at block 704, providing the synchronized output signal PRES_SYNC to the finite state machine 516 of the multi-modulus divider 500.

At block 706, the operations 700 include synchronizing the programming signal MODE that the state logic 518 of the finite state machine 516 generates based, at least in part, on the synchronized output signal PRES_SYNC. For instance, the programming signal MODE may be provided to the data input 532 of the second flip-flop 522, and the second flip-flop 522 may synchronize the programming signal MODE according to the synchronized output signal PRES_SYNC that is provided to the clock input 530 of the second flip-flop 522. In certain aspects of the present disclosure, the second flip-flop 522 may be configured to synchronize the programming signal MODE on a rising edge of the synchronized output signal PRES_SYNC. The operations 700 further include, at block 708, providing the synchronized programming signal MODE_SYNC to the third flip-flop 524 of the multi-modulus divider 500.

At block 710, the operations 700 include resynchronizing the synchronized programming signal MODE_SYNC using the third flip-flop 524 of the multi-modulus divider 500. For instance, the synchronized programming signal MODE_SYNC may be provided to the data input 532 of the third flip-flop 524, and the third flip-flop 524 may resynchronize the synchronized programming signal MODE_SYNC according to the input clock signal CLK_IN that is provided to the clock input 530 of the third flip-flop 524. In certain aspects of the present disclosure, the third flip-flop 524 may be configured to resynchronize the synchronized programming signal MODE_SYNC on a rising edge of the input clock signal CLK_IN. The operations 700 further include, at block 712, providing the resynchronized programming signal MODE_RESYNC to the prescaler 502, specifically the combinational logic circuit 506 thereof.

Example Aspects

In addition to the various aspects described above, specific combinations of aspects are within the scope of the present disclosure, some of which are detailed below:

Aspect 1: A multi-modulus divider comprising: a prescaler comprising a combinational logic circuit programmable to divide a frequency of an input clock signal by a first value or a second value; a finite state machine; a first flip-flop, wherein a data input of the first flip-flop is coupled to an output of the prescaler, and wherein an output of the first flip-flop is coupled to an input of the finite state machine; a second flip-flop, wherein a data input of the second flip-flop is coupled to the finite state machine such that the data input of the second flip-flop is configured to receive a programming signal output by the finite state machine and associated with programming the combinational logic circuit; and a third flip-flop, wherein a data input of the third flip-flop is coupled to an output of the second flip-flop, and wherein an output of the third flip-flop is coupled to the combinational logic circuit.

Aspect 2: The multi-modulus divider of Aspect 1, wherein a longest flop-to-flop delay is a summation of a first delay associated with the first flip-flop and a second delay associated with the second flip-flop.

Aspect 3: The multi-modulus divider of Aspect 1 or 2, wherein the input clock signal has a frequency that is greater than 7 Gigahertz (GHz).

Aspect 4: The multi-modulus divider of any of Aspects 1 to 3, wherein the first flip-flop, the second flip-flop, and the third flip-flop each comprise a delay (D) flip-flop.

Aspect 5: The multi-modulus divider of any of Aspects 1 to 4, wherein a clock input of the first flip-flop and a clock input of the third flip-flop are configured to receive the input clock signal.

Aspect 6: The multi-modulus divider of any of Aspects 1 to 5, wherein the finite state machine includes the second flip-flop.

Aspect 7: The multi-modulus divider of any of Aspects 1 to 6, wherein the first value is a first integer and the second value is a second integer that is different than the first integer.

Aspect 8: The multi-modulus divider of any of Aspects 1 to 7, wherein the prescaler further comprises a plurality of flip-flops, each of the plurality of flip-flops including a data input coupled to the combinational logic circuit and an output coupled to the combinational logic circuit.

Aspect 9: The multi-modulus divider of Aspect 8, wherein the data input of the first flip-fop is coupled to the output of one of the plurality of flip-flops of the prescaler.

Aspect 10: The multi-modulus divider of Aspects 1 to 9, wherein the output of the first flip-flop is coupled to a clock input of the second flip-flop.

Aspect 11: A phase-locked loop (PLL) circuit comprising the multi-modulus divider of Aspects 1 to 9.

Aspect 12: A method of clock signal generation comprising: synchronizing, via a first flip-flop of a multi-modulus divider, an output signal generated by a prescaler of the multi-modulus divider; providing the synchronized output signal to a finite state machine of the multi-modulus divider; synchronizing, via a second flip-flop of the multi-modulus divider, a programming signal output by the finite state machine, wherein the programming signal is associated with programming a combinational logic circuit of the prescaler; providing the synchronized programming signal to a third flip-flop of the multi-modulus divider; resynchronizing, via the third flip-flop, the synchronized programming signal; and providing the resynchronized programming signal to the combinational logic circuit of the prescaler.

Aspect 13: The method of Aspect 12, further comprising: providing the synchronized output signal to a clock input of the second flip-flop.

Aspect 14: The method of Aspects 12 or 13, wherein synchronizing the programming signal comprises synchronizing, via the second flip-flop, the programming signal on a rising edge of the synchronized output signal.

Aspect 15: The method of any of Aspects 12 to 14, further comprising: receiving, at the prescaler, an input clock signal; and generating the output signal based, at least in part, on the input clock signal.

Aspect 16: The method of Aspect 15, further comprising: providing the input clock signal to a clock input of the first flip-flop; and providing the input clock signal to a clock input of the third flip-flop.

Aspect 17: The method of Aspect 16, wherein synchronizing the output signal comprises synchronizing, via the first flip-flop, the output signal on a rising edge of the input clock signal.

Aspect 18: The method of Aspect 16, wherein resynchronizing the synchronized programming signal comprises resynchronizing, via the third flip-flop, the synchronized programming signal on a rising edge of the input clock signal.

Aspect 19: The method of any of Aspects 12 to 18, wherein a longest flop-to-flop delay is a summation of a first delay associated with the first flip-flop and a second delay associated with the second flip-flop.

Aspect 20: The method of any of Aspects 12 to 19, wherein finite state machine includes the second flip-flop.

Additional Considerations

Certain aspects of the present disclosure use a multi-modulus divider for clock signal generation. The multi-modulus divider includes a first flip-flop coupled between a prescaler of the multi-modulus divider and a finite state machine of the multi-modulus divider. The multi-modulus divider further includes a second flip-flop that is part of the finite state machine as well as a third flip-flop that is coupled between the finite state machine, specifically the second flip-flop thereof, and the prescaler. The first flip-flop and the third flip-flop that are both external to the prescaler and the finite state machine remove a delay associated with a combinational logic circuit of the prescaler from a combinational delay of the multi-modulus divider. This may be important because the delay associated with the combinational logic circuit takes up a larger percentage of a clock cycle as the frequency of the input clock signal increases (e.g., more than 9 Gigahertz). Thus, multi-modulus dividers having first and third flip-flops according to certain aspects of the present disclosure have improved performance (e.g., relaxed flip flop speeds, less power consumption, etc.) compared to conventional multi-modulus dividers.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A multi-modulus divider comprising:
a prescaler comprising a combinational logic circuit programmable to divide a frequency of an input clock signal by a first value or a second value;
a finite state machine;
a first flip-flop, wherein a data input of the first flip-flop is coupled to an output of the prescaler, and wherein an output of the first flip-flop is coupled to an input of the finite state machine;
a second flip-flop, wherein a data input of the second flip-flop is coupled to the finite state machine such that the data input of the second flip-flop is configured to receive a programming signal output by the finite state machine and associated with programming the combinational logic circuit; and
a third flip-flop, wherein a data input of the third flip-flop is coupled to an output of the second flip-flop, and wherein an output of the third flip-flop is coupled to the combinational logic circuit.

2. The multi-modulus divider of claim 1, wherein a longest flop-to-flop delay is a summation of a first delay associated with the first flip-flop and a second delay associated with the second flip-flop.

3. The multi-modulus divider of claim 1, wherein the input clock signal has a frequency that is greater than 7 Gigahertz (GHz).

4. The multi-modulus divider of claim 1, wherein the first flip-flop, the second flip-flop, and the third flip-flop each comprise a delay (D) flip-flop.

5. The multi-modulus divider of claim 1, wherein a clock input of the first flip-flop and a clock input of the third flip-flop are configured to receive the input clock signal.

6. The multi-modulus divider of claim 1, wherein the finite state machine includes the second flip-flop.

7. The multi-modulus divider of claim 1, wherein:
the first value is a first integer, and
the second value is a second integer that is different than the first integer.

8. The multi-modulus divider of claim 1, wherein the prescaler further comprises a plurality of flip-flops, each of the plurality of flip-flops including a data input coupled to the combinational logic circuit and an output coupled to the combinational logic circuit.

9. The multi-modulus divider of claim 8, wherein the data input of the first flip-flop is coupled to the output of one of the plurality of flip-flops of the prescaler.

10. The multi-modulus divider of claim 1, wherein the output of the first flip-flop is coupled to a clock input of the second flip-flop.

11. A phase-locked loop (PLL) circuit comprising the multi-modulus divider of claim 1.

\* \* \* \* \*